United States Patent [19]

D'Auria et al.

[11] Patent Number: 4,720,634
[45] Date of Patent: Jan. 19, 1988

[54] DEVICE FOR OPTICAL INTERCONNECTION OF ELECTRONIC COMPONENT CARDS WITHIN A CASE AND A METHOD OF FABRICATION OF SAID DEVICE

[75] Inventors: Luigi D'Auria, Sceaux; Jean P. Huignard, Paris; Claude Puech, Longjumeau; Jean P. Herriau, Bures Sur Yvette, all of France

[73] Assignee: Thomson-CSF, Paris, France

[21] Appl. No.: 832,420

[22] Filed: Feb. 24, 1986

[30] Foreign Application Priority Data

Feb. 26, 1985 [FR] France ................ 85 02767

[51] Int. Cl.$^4$ .................................. H04B 9/00
[52] U.S. Cl. ............................ 250/551; 250/227; 350/96.19; 350/162.23; 455/607
[58] Field of Search ............. 250/551, 227; 350/96.15, 96.19, 162.17, 162.2, 162.23; 455/606–608, 612

[56] References Cited

U.S. PATENT DOCUMENTS

| | | | |
|---|---|---|---|
| 4,063,083 | 12/1977 | Cathey | 455/607 |
| 4,310,216 | 1/1982 | Pellaux | |
| 4,314,283 | 2/1982 | Kramer | 350/96.19 |
| 4,447,118 | 5/1984 | Mulkey | |
| 4,591,270 | 5/1986 | Ahlén | 350/162.23 |
| 4,612,670 | 9/1986 | Henderson | 250/551 |

FOREIGN PATENT DOCUMENTS

8503179 7/1985 PCT Int'l Appl. .
0092395 10/1983 European Pat. Off. .

OTHER PUBLICATIONS

IBM Technical Disclosure Bulletin, vol. 26, No. 4, Sep. 1983, pp. 1793–1796, New York, US; L. Balliet, et al.: "Optical Transmission System for Interconnecting Electronic Units".
Applied Optics, vol. 22, No. 6, Mar. 1983, pp. 891–900, New York, US; W. B. Veldkamp: "Holographic Local-Oscillator Beam Multiplexing for Array Heterodyne Detection", Chapter IV: Holographic Phase Grating Fabrication; FIGS. 5, 6, 11.
Applied Optics, vol. 23, No. 17, Ler Sep. 1984, pp. 3004–3009, New York, US; J. M. P. Delavaux, et al.: "Design and Fabrication of Efficient Diffraction Transmission Gratings on Step-Index Optical Waveguides".
Proceedings of the Society of Photo-Optical Instrumentation Engineers, vol. 240, Periodic Structures, Gratings, Moire Patterns and Diffraction Phenomena, 29 juillet—ler aout 1980, San Diego, Calif., pp. 5–12, The Society of Photo-Optical Instrumentation Engineers, Washington, US; J. J. Cowan: "Blazed Holographic Gratings-Formation by Surface Waves and Replication by Metal Electroforming", Introduction; Blazed Holographic Grating—Paragraph 1; Nickel Electroforming; FIG. 1.
Patents Abstracts of Japan, vol. 7, No. 123, (E-178), [1268], 27, Mai 1983; & JP-A-58 42 333 (Fujitsu K.K.), 11-03-1983.
Patents Abstracts of Japan, vol. 8, No. 250, (E-279), [1687], Nov. 16, 1984, & JP-A-59 126 339, (Akai Denki K.K.), 20-07-1984.

*Primary Examiner*—Edward P. Westin
*Attorney, Agent, or Firm*—Oblon, Fisher, Spivak, McClelland, & Maier

[57] ABSTRACT

A device for establishing optical connection links between electronic component cards forming part of a package. The device comprises a transparent plate having parallel faces and a light source which emits a divergent beam and is implanted on a first card. The beam is reflected from a first optical diffracting element in the form of a collimated beam which undergoes multiple reflections from alternate reflecting elements to a second optical diffracting element and is converted by the second element to a convergent beam transmitted to a detector which is implanted on a second card.

22 Claims, 15 Drawing Figures

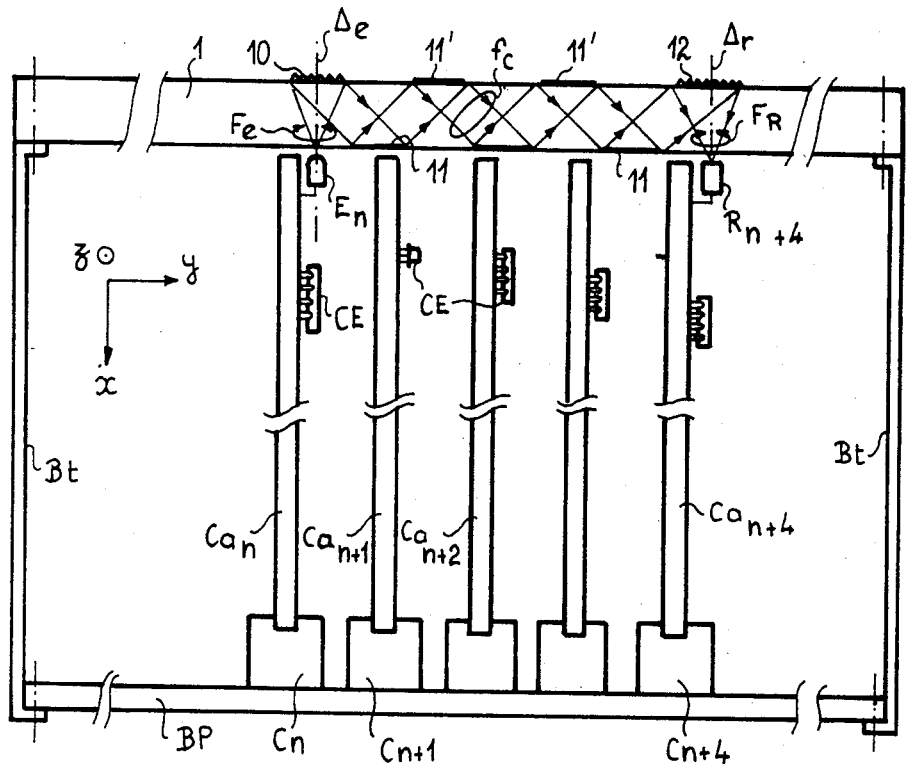
FIG_1
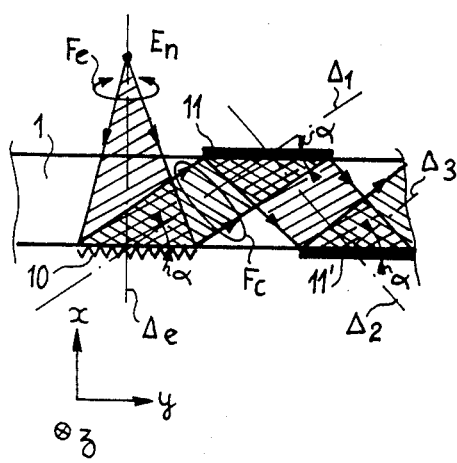
FIG_2
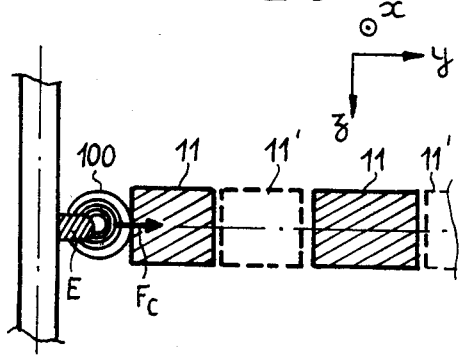
FIG_3

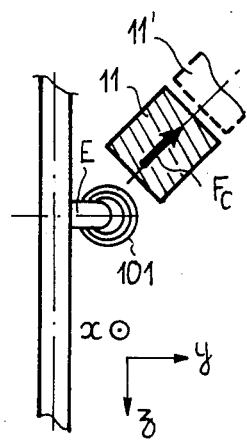
FIG_4
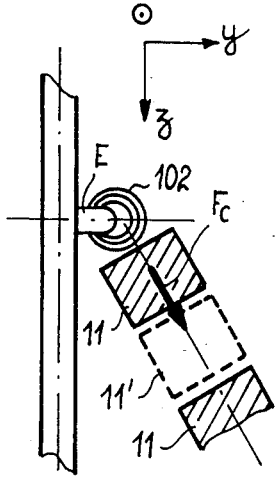
FIG_5
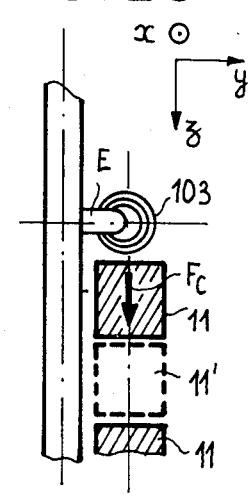
FIG_6
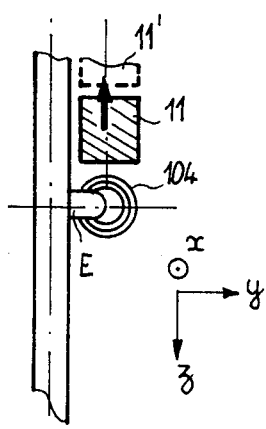
FIG_7
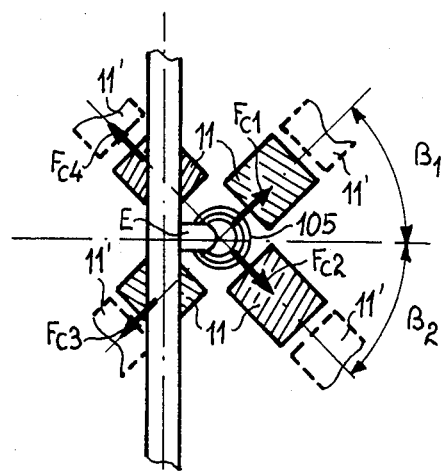
FIG_8

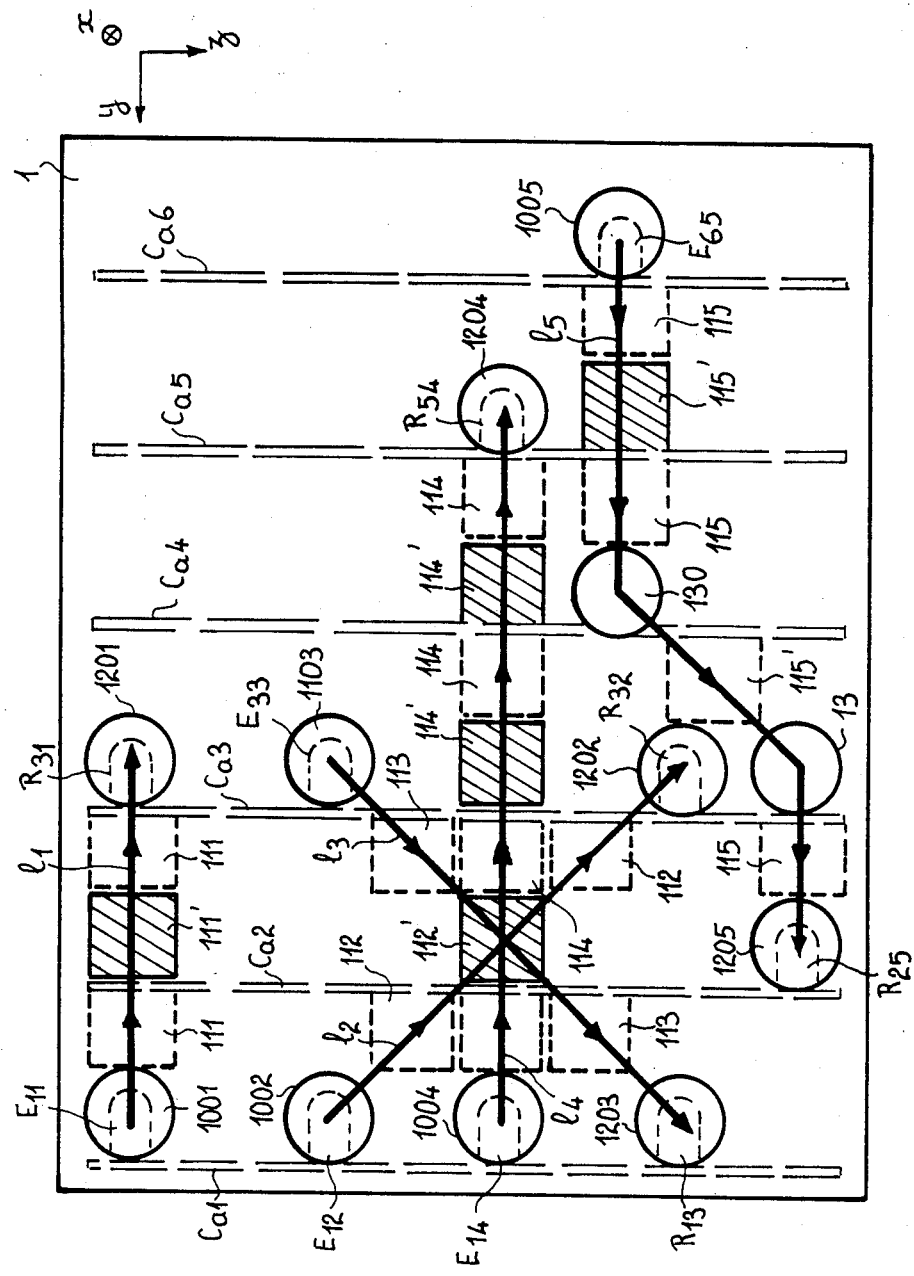
FIG_9

FIG_10
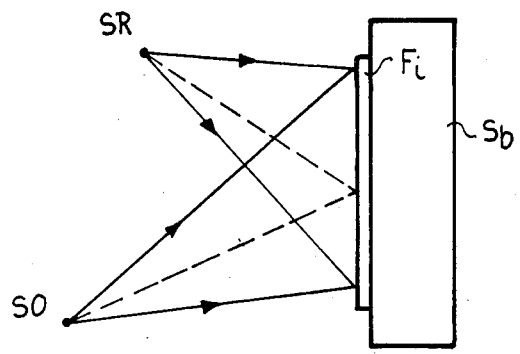
FIG_11
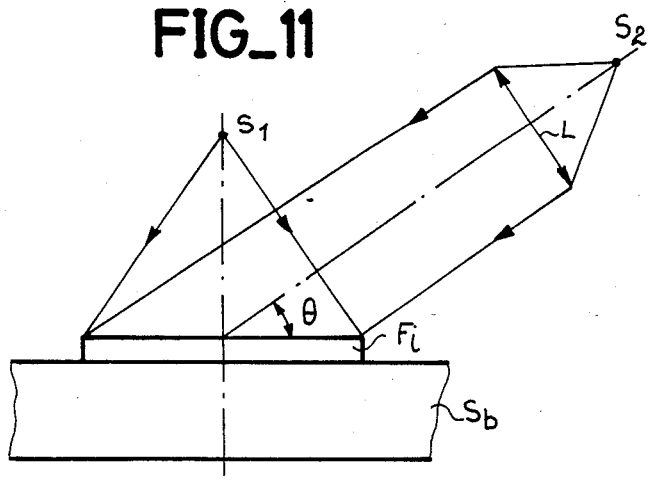
FIG_12
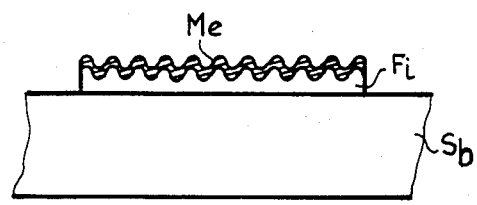

FIG_13
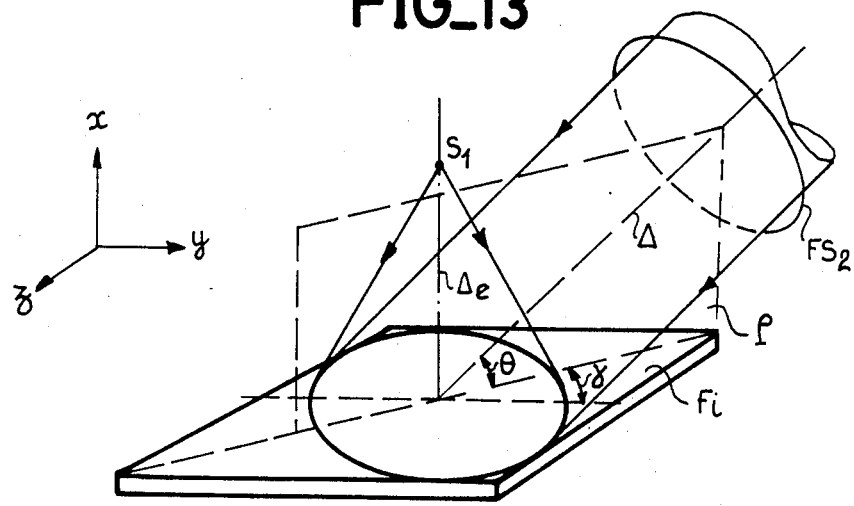
FIG_14
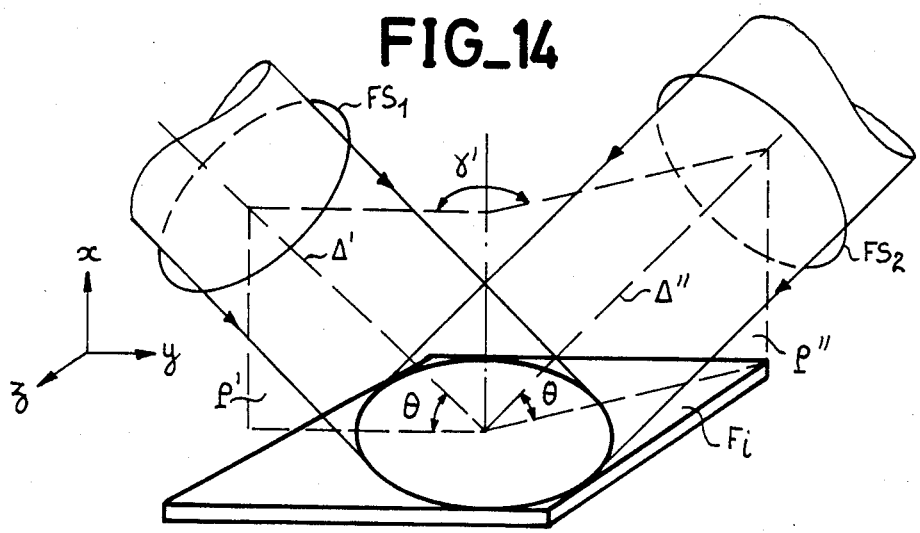
FIG_15
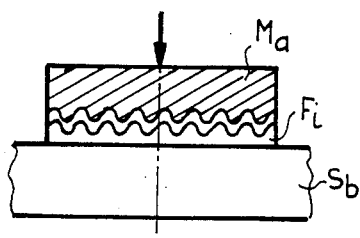

DEVICE FOR OPTICAL INTERCONNECTION OF ELECTRONIC COMPONENT CARDS WITHIN A CASE AND A METHOD OF FABRICATION OF SAID DEVICE

BACKGROUND OF THE INVENTION

1. Field of the Invention

The present invention relates to a device for optical interconnection between component cards placed within the case of an electronic equipment unit.

2. Description of the Prior Art

It is a conventional practice to construct an electronic equipment unit in which electronic components are mounted on cards and connected to each other by means of pointed circuit tracks. When a number of cards are employed, the cards are usually placed side-by-side and plugged into metal cases or so-called "packages" with their faces parallel to each other. The bottom wall of the package is provided with an array of multicontact electric connectors to which the cards are connected, said connectors being in turn joined to each other by means of a system of connecting leads. The cards are then guided and maintained by means of rails fixed on package walls and are intended to be plugged into the multicontact electric connectors. It is possible in some instances to establish connections between the connectors by means of a parent board formed with a printed circuit but it is often necessary to establish wire connections by reason of their number and their densely intercalated relationship. These card-edge connectors are not always sufficient and it often proves necessary to make use of complementary connectors on the front face of the package and sometimes even on the card faces. In such instances, the complementary connectors are coupled by means of conductors assembled together in the form of cables in order to facilitate extraction of cards. It is therefore wholly desirable to limit as far as possible the number of connecting leads which pass through the different connectors. This is even more true in the case of high-delivery connections which call for special precautions, such as coaxial cable connections which are very difficult to use in such an environment.

Particularly in the case of high-delivery connectors, it has consequently been proposed to make use of additional connections by optical means, or so-called optical links.

In the prior art, two main approaches have been adopted for establishing connections in the form of optical links.

In a first approach, an optical fiber is employed as a connecting lead between two cards. One end of the fiber is optically coupled to a light-emitting source which is modulated by data to be transmitted. The other end of the optical fiber is coupled to a light detector for converting light to electric signals. The source and the detector are naturally mounted on two different cards between which the optical link is to be established.

Provision must accordingly be made for transmitter and receiver bases, for connectors or similar elements and devices adapted to implantation on a printed circuit card.

An arrangement of this type is described, for example, in French patent Application No. FR-A-2,437,057.

This arrangement fails to overcome the disadvantages mentioned, that is to say the large number of physical connection layers or cables on the front or rear faces of the cards.

In another approach, it has been proposed to establish direct optical links between adjacent cards.

A communication is thus established by means of a light-emitting source placed on a first card and by means of a light detector fitted with a collimating lens and placed opposite to said light source on an adjacent second card.

This arrangement is described in French Certificate of Utility No. FR-A-2,537,825.

However, the optical links can be established only between two adjacent cards and not between two cards placed at any location in the package. Furthermore, it is necessary to provide each light detector with an additional discrete element consisting of a collimating lens.

SUMMARY OF THE INVENTION

The aim of this invention is to overcome the disadvantages of the prior art by providing an optical interconnection device for establishing multiple communication channels between any two cards or any number of cards of a given package while avoiding the bulk and complexity of optical-fiber connections.

The invention is therefore directed to an optical interconnection device for a package containing electronic component cards placed in side-by-side relation. The device serves to establish at least one optical link between a first card among a plurality of cards of the package and a second card, a light source being implanted on said first card for emitting a divergent beam of light energy in a first mean direction of propagation, a detector which is sensitive to said light energy being implanted on said second card. The device comprises a plate having parallel faces and placed opposite to the light source, said plate being formed of material which is transparent to the light produced by said source. At least the following optical elements are placed on the faces of said plate: a first optical element having a diffracting structure and placed on a first face of the plate opposite to the light source for receiving the divergent beam and reflecting said beam in the form of at least one collimated beam having a direction of propagation which forms a predetermined angle with the faces of the plate, reflecting elements arranged alternately on the two faces of the plate for receiving and reflecting the collimated beam, and a second optical element having a diffracting structure and placed on the first face of the plate for receiving the collimated beam after successive reflections within the plate from alternate reflecting elements and for reflecting said collimated beam in the form of a convergent beam in a second mean direction of propagation, said beam being received by said light detector which is implanted on the second card, thereby forming a continuous optical path between said first and second cards of the package.

The invention is further directed to a method for the fabrication of a device of this type.

BRIEF DESCRIPTION OF THE DRAWINGS

Other features of the invention will be more apparent upon consideration of the following description and accompanying drawings, wherein:

FIG. 1 illustrates diagrammatically an electronic equipment unit incorporating an optical interconnection device in accordance with the invention;

FIG. 2 is an enlarged detail view of the device in accordance with the invention;

FIGS. 3 to 8 illustrate diagrammatically optical diffracting-structure elements employed by the invention, in a number of different alternative embodiments;

FIG. 9 illustrates an example of configuration of a complete system of optical interconnections in accordance with the invention;

FIGS. 10 to 14 illustrate the steps involved in the method of fabrication of optical diffracting-structure elements in a first alternative embodiment;

FIG. 15 illustrates a particular step of the method of fabrication of optical diffracting-structure elements in a second alternative embodiment.

DESCRIPTION OF THE PREFERRED EMBODIMENTS

FIG. 1 illustrates diagrammatically an electronic equipment unit in which the device according to the invention is incorporated.

In the conventional arrangement, this equipment unit is made up of a set of printed circuit cards $Ca_n$ to $Ca_{n+4}$ on which various electronic components CE are implanted. These cards plug into mutlicontact electric connectors $C_n$ to $C_{n+4}$ referred-to as card-edge connectors. These connectors are in turn attached to a parent board BP or so-called back panel usually consisting of a printed circuit board having the function of establishing electrical connections between the different cards $Ca_n$ to $Ca_{n+4}$. The assembly is placed within a metal case Bt or "package" provided with card guides (not shown in FIG. 1).

In accordance with the invention, the device which serves to establish optical connections (hereinafter designated as optical links) comprises a cover consisting of a plate 1 having parallel faces and formed of material which is transparent to the wavelengths employed for establishing said optical links. Said plate is placed at right angles to the planes of the cards $Ca_n$ to $Ca_{n+4}$, which are printed circuit cards in the example illustrated. Said plate 1 is so arranged as to constitute the front panel of the package Bt although this arrangement does not imply any limitation of the invention.

In the description which now follows, it will be supposed that the cards $Ca_n$ to $Ca_{n+4}$ are arranged in parallel relation to a plane zx of an orthonormal trihedron xyz. The principal faces of the plate 1 are therefore parallel to the plane yz of said trihedron.

Should it be desired to establish an optical link between any two cards of the package Bt such as the cards $C_n$ and $C_{n+4}$ considered by way of example in FIG. 1, a light emitter $E_n$ is placed opposite to the plate 1 on a first card $Ca_n$ and a light detector $R_{n+4}$ is placed opposite to the plate 1 on a second card $Ca_{n+4}$. It is postulated in the example illustrated that the optical connection is a one-way link in the direction considered from card $Ca_n$ to card $Ca_{n+4}$.

In order to establish the optical link in accordance with the invention, a laser diode or an electroluminescent diode, for example, is placed opposite to the light-emitting source $E_n$ and an optical element 10 is placed on the opposite face of the plate 1 or in other words the external face in FIG. 1. Said optical element 10 is constituted by a diffracting structure of the optical grating type.

The light source $E_n$ emits a divergent beam $F_e$ in a mean direction of propagation $\Delta_e$ perpendicular to the parallel faces of the plate 1 or in other words in a direction parallel to the axis x.

The function of this optical element is to reflect the incident beam and to convert this latter to a collimated beam $F_c$.

FIG. 2 is an enlarged detail view of the device in accordance with the invention.

The optical element 10 therefore reflects the incident beam so as to convert it to a collimated beam $F_c$ in a mean direction of propagation $\Delta_1$ which forms an angle $\alpha$ with the parallel faces of the plate 1, said direction $\Delta_1$ being located in a plane parallel to the plane xy or else perpendicular to the cards. Preferably, the value chosen for the angle $\alpha$ is equal to $(\pi/4)$ radian.

According to a further aspect of the invention, reflecting elements 11 and 11' are placed alternately on the two faces of the plate 1. The function of said reflecting elements is to intercept the light rays reflected from the optical refracting-structure element 10 and in turn to reflect the rays in the directions $\Delta_2$ and $\Delta_3$ shown in FIG. 2. These two directions also form angles which are equal at absolute value to the angle $\Delta$ with the parallel faces of the plate 1. By means of this system of optical reflecting elements, an optical link is therefore established from one point to the next between the card $Ca_n$ (FIG. 1) and the card $Ca_{n+4}$. In the description given hereinafter, the optical element 10 will be referred-to as the light-emitting element.

A second optical element 12 having a diffracting structure is placed opposite to the receiver $R_{n+4}$ which can be a pin-type diode, for example. This pin diode is placed on the external face of the plate 1 and its function is reverse to that of the optical element 10. The optical element 12 which will hereinafter be designated as the optical receiving element receives the collimated beam reflected from the last reflecting element 11 (said element being placed on the internal face of the plate 1) at an angle of incidence $\alpha$, then converts it to a convergent beam $F_R$ which is transmitted in a mean direction of propagation $\Delta_r$ which is perpendicular to the faces of the plate 1, that is to say parallel to the axis x. The detector $R_{n+4}$ picks up these light rays and converts them to an electric signal. By means of the device in accordance with the invention, an optical link is effectively established between any two cards of the package Bt. In the example illustrated, the direction of said optical link is orthogonal to the planes of the printed circuit cards.

A point worthy of note is that, if the active faces of the emitter $E_n$ and receiver $R_{n+4}$, namely the faces employed respectively for emission and reception, are located at the same distance from the external face of the plate 1, the elements 10 and 12 in fact have a similar configuration. The method adopted for the fabrication of these elements will hereinafter be described in greater detail.

According to yet another aspect of the invention, the configuration to be adopted for the optical emitting and receiving elements can be selected from a number of alternatives.

In a first configuration illustrated in FIG. 3 in regard to the optical emitting element, if a light-emitting source E emits in a mean direction of propagation parallel to the axis x, the optical emitting element designated by the reference 100 in FIG. 3 reflects and converts the incident beam to a collimated beam $F_c$ having a mean direction of propagation located in a plane perpendicular to the cards or a plane parallel to the plane xy or else parallel to the principal faces of the plate 1. In the example illustrated in FIG. 3, propagation takes place from left to right, the beam being subjected to multiple reflections by reason of the alternate arrangement of the reflecting elements 11 and 11'. It should be added that this first type of optical emitting element is identical with the element illustrated in FIG. 1. When rotated through $\pi$ radians, a similar element would "emit" a collimated beam, again in parallel relation to the axis y but in reverse with respect to the direction illustrated in FIG. 3.

The same remarks naturally apply to the optical receiving elements (such s the element 12 shown in FIG. 1). In the configurations which will hereinafter be described with reference to FIGS. 4 to 8, these elements will no longer be specifically mentioned since it will be understood that these configurations also apply to these elements.

Among the various alternatives which may be considered, FIGS. 4 to 7 illustrate four other particular configurations of optical emitting elements, these elements being designated by the references 101 to 104.

By analogy with the configuration which has just been described and which serves to establish an optical link in a direction perpendicular to the planes of the printed circuit cards, the optical emitters obtained have the following designations: "($\pi/4$) radians, left" (emitter 101 in FIG. 4); "($\pi/4$) radians, right" (emitter 102 in FIG. 5); "($\pi/2$) radians, left" (emitter 107 in FIG. 5) and "($\pi/2$) radians, right" (emitter 104 in FIG. 7).

These configurations are the most simple: integral multiple angles of ($\pi/4$) radians, only one preferential direction of reflection and only one preferential sense of reflection.

It is possible, however, to realize more complex configurations which reflect in two or more different preferential directions.

By way of example (considered among others), FIG. 8 illustrates one example of element 105 for establishing four separate and distinct links from a single light-emitting source E. In the example of FIG. 8, the optical links are established in directions which form angles $\beta_1$ and $\beta_2$ with a plane orthogonal to the printed circuit cards. These angles are equal to ($\pi/4$) radians in the example illustrated in FIG. 8.

By making use of optical diffracting-structure elements in a number of different configurations, it is possible to realize a complex system of optical interconnections between the cards of one and the same package.

FIG. 9 illustrates diagrammatically one example of a system of optical links of the type under consideration.

For the sake of enhanced clarity, the total number of printed circuit cards $Ca_1$ to $Ca_6$ has been limited to six. Furthermore, the electric connectors, the card which supports said connectors as well as the case are not illustrated in this figure.

The optical links shown are five in number and illustrate a few of the possibilities offered by the device in accordance with the invention.

This figure represents a front view of the plate 1.

A first optical link $l_1$ connects the card $Ca_1$ to the card $Ca_3$ by means of a light-emitting source $E_{11}$ which is optically coupled to an optical emitting element 1001 placed on the front face of the plate 1, reflecting elements 111 and 111' placed alternately on the front and rear faces of the plate 1 and an optical receiving element 1201 placed on the front face of the plate 1 and optically coupled to a light detector $R_{31}$. The connection $l_1$ is established in a direction of propagation at right angles to the planes of the cards $Ca_1$ to $Ca_6$.

Similarly, diagonal links $l_2$ and $l_3$ inclined at ($\pi/4$) radians are established on the one hand between the cards $Ca_1$ and $Ca_3$ and on the other hand, and conversely, between the cards $Ca_3$ and $Ca_1$.

The link $l_2$ is established by means of the following components: light source $E_{12}$, ($\pi/4$) radian optical emitting element 1102, optical reflecting elements 112 and 112', ($5\pi/4$) radian optical receiving element 1202 and light detector $R_{32}$.

The link $L_3$ is formed by means of the following components: light source $E_{33}$, ($3\pi/4$) radian optical emitting element 1103, optical reflecting elements 113 and 112', ($-\pi/4$) radian optical receiving element 1203 and light detector $R_{32}$.

A link $l_4$ in a direction at right angles to the planes of the cards is established between the card $Ca_1$ and the card $Ca_5$ and makes use of a light source $E_{14}$, an optical emitting element 1004, alternate reflecting elements 114, 114', and 112', an optical receiving element 1204 and a light detector $R_{54}$.

It should be noted that the reflecting element 112' is common to the three links $l_2$ to $l_4$. This does not give rise to any problem of crosstalk by reason of the associated properties of directivity of the optical emitting and receiving elements.

Finally, an optical link is established between the card $Ca_6$ and the card $Ca_2$. This link is more complex than the links $l_1$ to $l_4$ described earlier.

In fact, according to an advantageous aspect of the invention optical diffracting-structure elements of a third type are employed.

Consideration is given here to intermediate elements which permits changes in direction of propagation of the collimated beams.

In contrast to the optical emitting and receiving elements, the function of the optical elements of the third type is to reflect a collimated beam without changing its nature but in such a manner as to change its direction of propagation. it will naturally be understood that the expression "direction of propagation" as used in this specification is intended to mean the projection in the plane yz, that is to say in a plane parallel to the faces of the plate 1.

Referring again to FIG. 9, the light source $E_{65}$ emits a divergent beam in a mean direction of propagation parallel to the axis x, the optical emitting element 1005 converts said divergent beam to a beam which is collimated as it approaches an optical element 130 placed at the level of the $Ca_4$ after alternate reflections from reflecting elements 115 and 115'.

Said optical element 130 deflects the direction of propagation through ($5\pi/4$) radians towards an optical element 131 of the same type after an intermediate reflection from a reflecting element 115'. The beam downstream of the element 130 also undergoes an intermediate reflection from a reflecting element 115 placed on the rear face of the plate 1.

The element 131 again deflects the direction of propagation through ($+\pi/4$) radians towards an optical receiving element 1205 via a reflecting element 115 which is also placed on the rear face of the plate 1. The optical link $l_5$ between the cards $Ca_6$ and $Ca_2$ is thus completed. It is observed that the optical diffracting-structure elements 130 and 131 of the third type shown in FIG. 9 simply take the place of a reflecting element on the appropriate face of the plate 1 in order to maintain an alternate arrangement.

In the description which now follows, the elements mentioned in the foregoing will be designated as optical elements for changing the direction of propagation.

In FIG. 9, the elements 130 and 131 are placed only on the front face but a different arrangement could have been adopted.

In a manner which is similar to that described with reference to FIGS. 3 to 8, the optical elements for changing the direction of propagation can be given different configurations. The only difference is that they do not convert an incident collimated beam to a convergent beam as is the case with the optical receiving elements.

It is readily apparent that the practical application of the optical diffracting-structure elements in their different alternative designs and of reflecting elements in association with light-emitting sources and light detectors permits straightforward construction of a complex system of optical interconnections between any cards of one and the same package.

In short, an optical link between a light source and a light detector in accordance with the invention calls at least for the use of an optical emitting element, of an optical receiving element and of alternate reflecting elements. As an optional feature, it is also possible to employ one or a number of optical elements for changing the direction of propagation, such as the elements 130 and 131.

These links do not entail the need in any instance for costly and complex elements such as optical connectors or optical fibers.

Moreover, the degree of precision required in the positioning of these elements is not as critical as the accuracy required for the construction of links by means of optical connectors and optical fibers.

In a typical application, a case contains approximately fifteen cards having a height of the order of fifteen centimeters. These cards are arranged in parallel relation and plugged into card-edge connectors with a pitch or spacing of two centimeters.

It is therefore reasonable to provide fifteen light-source or light-detector components with a pitch of one centimeter on each card.

Under these conditions, each elementary pattern occupies typically a zone having a surface which is inscribed within a square and has dimensions of 1 cm × 1 cm.

Although they are shown in the figures in the form of rectangular areas, the reflecting elements can have any suitable shape. It is also possible to adopt a uniform metallization of the two faces of the plate 1 except for the zones reserved for the optical elements having diffracting structures.

The method of fabrication of the device in accordance with the invention will now be explained in detail.

As has just been mentioned, the method of fabrication comprises a step which involves selective metallization of the two principal faces of the plate 1. This step does not give rise to any particular problem. Any suitable technique of the prior art may be employed. Selective deposition is obtained by masking.

In addition, there is no critical requirement in regard to the nature of the metal which may consist of silver, for example. Typically, the thickness of the deposit is within the range of one thousand to a few thousand Angströms.

The substrate, that is to say the plate 1 having parallel faces, can be of glass, of plastic or more generally of any material which is transparent to the wavelengths employed.

The method of fabrication also includes the steps involved in obtaining diffracting structures.

The general aim under consideration is to form optical gratings having well-defined properties for obtaining the various configurations described.

In order to achieve this objective, a preferred embodiment consists in having recourse to a holographic recording technique. It is a well-known fact that, if interference is set up in a photosensitive medium between two waves derived from coherent light sources, interference patterns are obtained. These two waves may even be generated by the same source by making use of a beam splitter.

FIG. 10 illustrates diagrammatically the process involved in formation of a hologram in a photosensitive film $F_i$ supported by a substrate. This film is illuminated by beams derived from an object source SO and a reference source SR at predetermined angles of incidence.

In order to obtain a definitive hologram, it is necessary to carry out a development step which may be followed if necessary by a fixing step, these steps being similar to those adopted in conventional photography.

By way of example, it is possible within the scope of the invention to employ a photosensitive material consisting of dichromated gelatin or a photoresist.

In the first case, development is performed by means of a solution of alcohol in water and fixing is obtained by encapsulation, this material being strongly hydrophilic.

In the second case, development is performed by means of commercially available products adapted to the particular photoresist. As a rule, fixing is obtained by annealing.

Once it has stabilized, the diffracting structure thus obtained can be "re-read". This structure is illuminated by a beam having the same characteristics as the reference beam.

There are two types of gratings in existence, depending on whether the writing beams illuminate the film on one and the same side as illustrated in FIG. 10 or on both principal faces. Transmission gratings and reflection gratings respectively are accordingly obtained.

In the first case of transmission gratings, the pitch Λ of these gratings is typically within the range of 0.5 to a few micrometers. In the second case of reflection gratings, the pitch Λ is typically within the range of 0.1 to 0.3 micrometer. This second type of grating is therefore more difficult to construct.

In consequence, although the final product has to be a reflecting structure, an initial step preferentially contemplated within the scope of the invention consists in forming a grating of the transmission type, this grating being then made reflecting by metallization in a second step.

The formation of a grating in accordance with the invention can be carried out in accordance with two principal alternative methods.

In a first alternative method illustrated in FIGS. 11 and 12, formation of the diffracting structure is carried out directly on a photosensitive film $F_i$.

A first step illustrated in FIG. 11 consists in generating a special diffraction pattern by illuminating the film with two beams as stated with reference to FIG. 10. In order to form diffracting structures in accordance with the invention, one of the beams must be a divergent beam or in other words a spherical wave whereas the other beam must be a collimated beam or in other words a plane wave, at least in regard to optical elements of the emitting and receiving types.

It must also be ensured that particular conditions of incidence are satisfied in order to obtain a number of different configurations as described with reference to FIGS. 3 to 7.

A first coherent source $S_1$ which is assimilated with a point source illuminates the film at a mean angle of incidence which is normal to the plane of the film. The distance between the source $S_1$ and the film must be equal to the distance between the light sources mounted on the printed circuit cards (source $E_n$ in FIG. 1) and the external face of the plate 1 on which the optical emitting element is placed (element 10 in FIG. 1). There is usually very little difference between this distance and the thickness of the plate.

A second coherent source $S_2$ associated for example with a collimating lens L illuminates the film by means of a beam of parallel light rays at an angle of incidence $\theta$.

The illumination stage is followed by stages of development and fixing of the hologram produced in the film $F_i$ in a conventional manner.

The optical grating thus obtained is provided in the form of a film having microreliefs on its external face.

In order to endow this grating with reflecting properties, it is necessary to carry out a metallization of the above-mentioned external face as illustrated in FIG. 12. A layer of metal $M_e$, typically within the thickness range of one thousand to a few thousand Ångströms, is deposited by means of any suitable method. By way of example, the metal employed can be silver, gold or copper.

If the external face of the grating thus obtained is illuminated by a source which reproduces the characteristics of the source $S_1$, said grating converts the divergent illuminating beam to a reflected collimated beam having a direction of propagation which forms an angle $\theta$ with the internal face of the film $F_i$.

Referring again to FIG. 2, it is only necessary to choose the angle $\theta$ equal to the angle $\alpha$ in order to establish the conditions of operation of the optical emitting element 10.

By analogy, this also holds true in the case of the optical receiving element (for example the element 12 shown in FIG. 1). If the internal face of the grating is illuminated by a collimated beam having an angle of incidence $\theta$, said beam is reflected and converted to a convergent beam having a mean direction of propagation normal to the internal face of the grating.

In a preferential manner, the value chosen for the angle $\theta$ is $(\pi/4)$ radians.

It is readily apparent that different configurations of optical emitting or receiving elements can be obtained, in particular the configurations explained in detail with reference to FIGS. 3 to 8.

FIG. 13 provides an explanatory illustration of the procedure to be adopted. It will be supposed that the photosensitive film $F_i$ has a square or rectangular shape, that the sides of the square or rectangle are parallel to two axes z and y of an orthonormal trihedron xyz and that the principal faces of the printed circuit cards placed within the case (reference Bt in FIG. 1) are parallel to the plane xz.

Should it be desired to obtain links in directions other than the normal to the principal faces of these cards, it is consequently only necessary to adjust the mean direction of propagation of the collimated beam.

If $\Delta$ is the optical axis of the collimated beam $FS_2$ produced by the source $S_2$ (not shown in FIG. 13), said axis is located in plane P at right angles to the principal faces of the film $F_i$, that is to say at right angles to the plane zy.

In order to obtain a preferential direction of propagation in reflection, it is only necessary to adjust the angle $\gamma$ made by the plane P and the plane xy to a predetermined value such as $(+\pi/4)$ radians, for example.

When it is desired to have a number of preferential directions such as, for example, four directions as in the case of the configuration of FIG. 8, it is necessary to record a corresponding number of different holograms in the film $F_i$.

This can be achieved simply by carrying out a number of exposures, for example by rotating the plane P about an axis $\Delta_e$, which is the mean direction of emission of the source $S_1$. This axis naturally remains normal to the surface of the film $F_i$ and the source $S_1$ remains stationary. To this end, it is possible either to displace the source $S_2$ in space or to rotate the film $F_i$ about the axis $\Delta_e$.

In the case of the optical elements for changing the direction of propagation such as the elements 130 and 131 of FIG. 9, the nature of the illuminating beams and the conditions of incidence are clearly different.

FIG. 4 illustrates this example.

The photosensitive film must be illuminated by two collimated beams $FS_1$ and $FS_2$.

The optical axes $\Delta'$ and $\Delta''$ of said beams have a common incidence equal to the aforesaid angle $\theta$. These axes are contained respectively in planes P' and P'' which are located at right angles to the principal planes of the film $F_i$ and form between each other an angle equal to $\gamma'$. This angle $\gamma'$ represents the desired change of direction.

When performing a reading operation, the grating which is illuminated by a collimated beam having an axis $\Delta'$ in fact reflects this beam in the form of a beam which is also collimated but has an axis $\Delta''$. Conversely, the optical system thus formed is reversible.

In accordance with the invention, the value chosen for $\gamma'$ is preferably equal to $(\pm\pi/4)$ or to $(\pm\pi/2)$, depending on the changes of direction which may be desired.

It has been assumed in the foregoing that the wavelength employed in a writing operation and the wavelength employed in a reading operation (the read wavelength being that of the light sources implanted on the printed circuit cards) are identical or at least very close in value.

This, however, is not usually the case. In a preferred application of the device in accordance with the invention, the optical links utilize electroluminescent diodes which emit at a wavelength centered on the value of 840 nanometers. In point of fact, the photosensitive materials usually employed exhibit a maximum value of sensitivity within the wavelength spectrum which corresponds to a range of 450 to 550 nanometers. In this case, reading and writing must be performed under different conditions of incidence. This phenomenon is known as the Bragg effect. The requisite corrections can be made by computation in which wavelength shift is taken into account.

After metallization, diffraction efficiencies of at least 50% can be obtained.

In a second alternative embodiment of the method of fabrication, the diffracting structures are obtained by pressing from a matrix.

To this end, diffraction gratings are constructed in a manner similar to the method already indicated with reference to FIG. 11 and involving illumination, development and fixing.

The microrelief is then transferred to a matrix constituted by a metal layer of nickel, for example. This transfer can be carried out by means of the techniques usually employed for duplication of optical disks.

The next step illustrated in FIG. 15 consists of a pressing operation. The underface of the matrix Ma carries the pattern to be duplicated and said matrix is pressed against a film $F_i$ of malleable material such as thermoplastic material, polymer, and so on.

Finally, as in the case of the first alternative embodiment, the duplicated microrelief is subjected to a metallization step as illustrated in FIG. 12.

This alternative embodiment of the method in accordance with the invention offers an advantage in that all the diffracting elements required for a complete system of interconnections can be formed on the plate 1 in a single operation.

Since the order of the process steps involving metallization and formation of diffracting structures is not critical, this alternative embodiment offers an additional advantage in that all the metallizations can be formed in a single operation, whether for the purpose of producing reflecting elements or for the purpose of metallizing diffracting structures. To this end, it is only necessary to carry out the metallization step at the end of the process.

The metallization deposit may be uniform. It is a sufficient requirement to preserve by masking only the zones which are subjacent to the optical emitting and receiving elements. These zones must in fact be transparent in order to permit the passage of radiations derived from the light sources or transmitted to the detectors.

Finally, in the event that the plate 1 is of plastic material, duplication of the refracting structures can be carried out directly on the plate during the pressing step without making use of intermediate films which have to be deposited on the plate.

The method in accordance with the invention is therefore particularly well-suited to mass production, especially for so-called "general public" equipment. While permitting high performances of optical links, this method achieves a marked reduction in both cost and complexity.

To help fix ideas, a device in accordance with the inventioàn can have the following typical technical characteristics:

The light sources can be electroluminescent semiconductor diodes for emitting a radiation spectrum centered on the wavelength 840 nm and having a bandwidth of approximately 80 nm ($\pm 40$ nm). The emissive surface is a rectangular quadrilateral having dimensions within the range of 50 to 80 micrometers. The injected current has a value of approximately 10 mA and the optical power emitted has a value of approximately 100 microwatts.

In respect of an error rate of less than $10^{-10}$ at a bit rate of the order of 100 Mbit/s, the detector comprising for example a semiconductor pin-type photodiode associated with an amplifier of low complexity, the optical power to be detected is of the order of one microwatt.

Under these conditions, maximum attenuation between light-emitting source and detector is equal to 20 dB.

In the case of a numerical aperture equal to 0.5, the coupling losses between the light source and the optical element can be estimated at 6 dB. Losses due to the reflecting elements are of the order of 0.1 dB. It can be estimated that the propagation losses are lower than 0.01 dB and may accordingly be disregarded.

There therefore remains a margin of the order of 10 dB. This margin makes it possible to take into account the efficiency of the diffracting structures, which is less than 100%.

In order to increase mechanical tolerances, it is an advantage to reduce the emissive surface of the light sources as far as possible and to increase the active surface of the detectors without producing any excessive increase in their electrical capacity.

With the order of magnitude of the emissive surface recalled earlier and in the case of a maximum electrical capacitance of 1 pF, the photodiode can have a typical circular detection surface, the diameter of which is equal to 500 micrometers.

The positioning tolerances on printed circuit cards can be of the order of $\pm 30$ micrometers.

The invention is not limited solely to the examples of construction specifically described in the foregoing. In particular, the transparent plate 1 which supports the optical elements having diffracting or reflecting structures can be arranged in many different configurations with respect to the printed circuit cards. It is only necessary to ensure that said plate is located opposite to the light emitters in order to receive the luminous flux from these latter and opposite to the light detectors which receive the luminous flux as it emerges from the plate after multiple reflections along the optical links which have been established.

What is claimed is:

1. An optical interconnection device for a package containing electronic component cards placed in side-by-side relation, the device being intended to establish at least one optical link between a first card among a plurality of cards of the package and a second card, a light source being implanted on said first card for emitting a divergent beam of light energy in a first mean direction of propagation, a detector which is sensitive to said light energy being implanted on said second card, comprising:

a plate having parallel faces and placed opposite to the light source, said plate being formed of material which is transparent to the light produced by said source(;);

at least the following optical elements being placed on the faces of said plate:

a first optical element having a diffracting structure and placed on a first face of the plate opposite to the light source for receiving the divergent beam and reflecting said beam in the form of at least one collimated beam having a direction of propagation which forms a predetermined angle with the faces of the plate, and which forms a predetermined angle with a reference plane which is perpendicular to the faces of the plate;

reflecting elements arranged alternately on the two faces of the plate for receiving and reflecting the collimated beam along a predetermined path, and a second optical element having a diffracting structure and placed on the first face of the plate for receiving the collimated beam after successive reflections within the plate from alternate reflecting elements along the predetermined path and for reflecting said collimated beam in the form of a convergent beam in a second mean direction of propagation, said beam being received by said light detector which is implanted on the second card, thereby forming a continuous optical path between said first and second cards of the package.

2. A device according to claim 1, wherein the reflecting elements are constituted by metallic areas deposited alternately on the two faces of the plate.

3. A device according to claim 1, wherein the reflecting elements are constituted by surface metallizations on both faces of the plate except for zones subjacent to the optical elements which have a diffracting structure.

4. A device according to claim 1, further comprising at least a third optical element having a diffracting structure and placed on one face of the plate, the function of said third optical element being to receive said collimated beam which propagates in a first direction comprised in a first plane and to reflect said beam in the form of at least one collimated beam which propagates in a second direction comprised in a second plane, a pre-established angle being formed between the two planes aforesaid.

5. A device according to claim 4, wherein the optical elements having a diffracting structure are films deposited on predetermined zones of the plate comprising an optical grating constituted by microreliefs which are metallized so as to form reflecting diffraction gratings.

6. A device according to claim 4, wherein the optical elements having a diffracting structure are optical gratings constituted by microreliefs formed in surface zones of the plate and metallized in order to form reflecting diffraction gratings.

7. A device according to claim 5 or claim 6, wherein the elements having a diffracting structure reflect an incident beam in the form of a plurality of collimated beams having separate and distinct directions of propagation.

8. A device according to claim 4 or claim 5 in which the cards of the package are all parallel to a predetermined plane, wherein each first and third optical diffracting-structure element is arranged on the plate so as to reflect an incident beam and form at least one collimated beam having a direction of propagation comprised in a plane which forms a pre-established angle with said predetermined plane.

9. A device according to claim 1, wherein each light source is an electroluminescent diode and wherein each light detector is a pin diode.

10. A method of fabrication of an optical interconnection device according to claim 1, comprising a step in which optical elements having a diffracting structure are formed in first surface zones of the faces of the plate and a step in which second zones of the faces of the plate are subjected to selective metallization in order to form said reflecting elements and to form at least one optical interconnection having a pre-established configuration.

11. A method according to claim 10, wherein the metallization step comprises a stage of uniform metallization of the two faces of the plate except for zones of said plate faces which are subjacent to the first zones aforesaid.

12. A method according to claim 11, wherein the step involving formation of optical elements having a diffracting structure comprises a stage of holographic recording of a diffraction pattern in a film of photosensitive material deposited on a flat support by producing within the material interference between a first coherent-light beam at a first angle of incidence and at least a second collimated coherent-light beam having a direction of propagation which forms a predetermined angle with said plane and a stage of development and fixing of the diffraction pattern so as to obtain an optical grating constituted by microreliefs.

13. A method according to claim 12, comprising a number of exposures to collimated coherent-light beams having separate and distinct directions of propagation.

14. A method according to claim 12, wherein the first beam is divergent at an angle of incidence normal to the plane of the support.

15. A method according to claim 12, wherein the first beam is a collimated beam having a direction of propagation which forms with the support plane an angle equal to said predetermined angle.

16. A method according to claim 12, wherein the photosensitive material is dichromated gelatin or a photoresist.

17. A method according to claim 12, comprising a step involving transfer of the optical grating constituted by microreliefs onto a matrix of material having substantial hardness.

18. A method according to claim 17, wherein said material is nickel.

19. A method according to claim 18, comprising a step in which said matrix is formed on a film of malleable material in order to duplicate thereon said optical grating constituted by miroreliefs.

20. A method according to claim 19, wherein the film is formed of thermoplastic material or of a polymer.

21. A method according to claim 19, wherein the plate having parallel faces is of plastic material and wherein said method comprises at least one step of pressing said matrix on one of the plate faces in order to ensure that the optical grating constituted by microreliefs is duplicated on said face in a pre-established zone thereof.

22. A method according to claim 10, comprising a step involving surface metallization of the grating constituted by microreliefs in order to endow said grating with reflecting properties.

* * * * *